(12) United States Patent
Bae et al.

(10) Patent No.: US 9,911,764 B2
(45) Date of Patent: Mar. 6, 2018

(54) DISPLAY APPARATUS AND METHOD OF MANUFACTURING THE SAME

(71) Applicant: Samsung Display Co., Ltd., Yongin-Si, Gyeonggi-Do (KR)

(72) Inventors: Jongsung Bae, Yongin-si (KR); Mugyeom Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/208,750

(22) Filed: Jul. 13, 2016

(65) Prior Publication Data

US 2017/0062492 A1    Mar. 2, 2017

(30) Foreign Application Priority Data

Aug. 31, 2015    (KR) .................... 10-2015-0123194

(51) Int. Cl.
| | |
|---|---|
| H01L 21/00 | (2006.01) |
| H01L 27/12 | (2006.01) |
| H01L 25/16 | (2006.01) |
| H01L 25/00 | (2006.01) |
| H01L 33/62 | (2010.01) |

(52) U.S. Cl.
CPC ........ *H01L 27/1259* (2013.01); *H01L 25/167* (2013.01); *H01L 25/50* (2013.01); *H01L 33/62* (2013.01); *H01L 2933/005* (2013.01); *H01L 2933/0033* (2013.01); *H01L 2933/0066* (2013.01)

(58) Field of Classification Search
CPC ... H01L 27/1259; H01L 25/167; H01L 25/50; H01L 33/62; H01L 2933/0033; H01L 2933/0066; H01L 2933/005
See application file for complete search history.

(56) References Cited

U.S. PATENT DOCUMENTS

| | | | |
|---|---|---|---|
| 2002/0096994 A1 | 7/2002 | Iwafuchi et al. | |
| 2004/0041164 A1 | 3/2004 | Thibeault et al. | |
| 2009/0267108 A1* | 10/2009 | Lin | H01L 24/24 257/99 |
| 2010/0187002 A1* | 7/2010 | Lee | H01L 24/75 174/260 |

(Continued)

FOREIGN PATENT DOCUMENTS

| | | |
|---|---|---|
| JP | 2011-198697 A | 10/2011 |
| KR | 20020069357 A | 8/2002 |

*Primary Examiner* — Dale E Page
*Assistant Examiner* — Quovaunda V Jefferson
(74) *Attorney, Agent, or Firm* — Cantor Colburn LLP

(57) ABSTRACT

A method of manufacturing a display apparatus includes separating a light-emitting diode ("LED") chip from a base substrate; disposing the separated light-emitting diode chip in a solution; disposing a substrate including a first electrode thereon, in the solution; with the separated light-emitting diode chip and the substrate including the first electrode thereon in the solution, applying a negative voltage to the substrate to attract the separated light-emitting diode chip to the first electrode on the substrate; mounting the light-emitting diode chip attracted to the first electrode, on the first electrode; and removing the substrate with the light-emitting diode chip mounted on the first electrode from the solution and drying the removed substrate, to form the display apparatus.

16 Claims, 11 Drawing Sheets

(56) References Cited

U.S. PATENT DOCUMENTS

2013/0027623 A1\* 1/2013 Negishi ............... H01L 25/0753
  349/42
2015/0187740 A1 7/2015 McGroddy et al.

\* cited by examiner

DISPLAY APPARATUS AND METHOD OF MANUFACTURING THE SAME This application claims priority to Korean Patent Application No. 10-2015-0123194, filed on Aug. 31, 2015, and all the benefits accruing therefrom under 35 U.S.C. § 119, the contents of which in their entirety are herein incorporated by reference.

BACKGROUND

1. Field

One or more exemplary embodiments relate to a method of manufacturing a display apparatus including light-emitting diodes ("LEDs") and a display apparatus manufactured by the method.

2. Description of the Related Art

A light-emitting diode ("LED") is a semiconductor device converting energy that is generated by recombination of electrons and holes that are injected to a PN junction diode by applying a forward voltage to the PN junction diode, into optical energy.

An inorganic LED emitting light by using inorganic compounds is widely used as a backlight of a liquid crystal display ("LCD") television ("TV"), illumination and an electric sign board. In addition, an organic LED emitting light by using organic compounds has been used in relatively small electronic appliances such as a cell phone to a large TV.

SUMMARY

Although an inorganic light-emitting diode ("LED") is relatively cheaper, relatively brighter, and lasts longer than an organic LED, the inorganic LED may not be directly formed on a flexible substrate by using a thin film processing like the organic LED.

One or more exemplary embodiments include a method of manufacturing a full-color display apparatus by transferring inorganic light-emitting diodes ("LEDs") directly onto a flexible substrate.

According to one or more exemplary embodiments of a method of manufacturing a display apparatus, the method includes: separating a light-emitting diode ("LED") chip from a base substrate; disposing the separated LED chip in a solution; disposing a substrate including a first electrode thereon, in the solution; with the separated LED chip and the substrate including the first electrode thereon in the solution, applying a negative voltage to the substrate to attract the separated LED chip to the first electrode on the substrate; mounting the LED chip attracted to the first electrode, on the first electrode; and removing the substrate with the LED chip mounted on the first electrode from the solution and drying the removed substrate, to form the display apparatus.

The separated LED chip may be a flip chip including a first contact pad and a second contact pad exposed facing a same direction.

The substrate may further include a second electrode spaced apart from the first electrode and insulated from the first electrode.

The applying the negative voltage to the substrate may include applying a first negative voltage to the first electrode and applying a second negative voltage to the second electrode.

The first and second negative voltages may be direct current ("DC") voltages.

The applying the negative voltage to the substrate may attract the first contact pad to the first electrode, and attract the second contact pad to the second electrode.

The method may further include encapsulating the LED chip mounted on the first electrode, on the substrate, after the removing and drying the substrate.

The LED chip may be individually encapsulated on the substrate.

The separating the LED chip from the base substrate may include separating LED chips which respectively generate and emit different color lights from each other, from the base substrate. A plurality of the LED chips among the plural LED chips may be encapsulated on the substrate by a common encapsulation member.

The separating the LED chip from the base substrate may include separating LED chips which respectively generate and emit different color lights from each other, from the base substrate. The mounting the LED chip may include mounting a first color LED chip on the first electrode. The method may further include after the removing and drying the substrate with the first color LED chip mounted on the first electrode, covering the first color LED chip mounted on the first electrode by a passivation layer, and for all other color LED chips among the plural LED chips, repeatedly performing the disposing the separated LED chip in the solution, the applying the negative voltage to the substrate, the mounting the LED chip and the removing and drying the substrate.

According to one or more exemplary embodiments of a method of manufacturing a display apparatus, the method includes: separating a plurality of LED chips having different shapes from each other, respectively from base substrates; disposing all of the separated plurality of LED chips having the different shapes in a solution; disposing a substrate including a plurality of recesses in which a plurality of first electrodes are respectively disposed, in the solution, the recesses having different shapes respectively corresponding to the different shapes of the plurality of LED chips; with the separated LED chips and the substrate including the plurality of first electrodes in the recesses thereof in the solution, applying a negative voltage to the substrate to respectively attract the separated LED chips to the plurality of first electrodes of the correspondingly shaped recesses of the substrate; respectively mounting the plurality of LED chips attracted to the plurality of first electrodes in the recesses having the different shapes, on the plurality of first electrodes; and removing the substrate with the plurality of LED chips mounted on the plurality of first electrodes from the solution and drying the removed substrate to form the display apparatus.

From among the separated plurality of LED chips having different shapes from each other, each LED chip may be a flip chip including a first contact pad and a second contact pad are exposed facing a same direction.

The substrate may further include a plurality of second electrodes respectively in the recesses in which in which the plurality of first electrodes is respectively disposed. Within respective recesses, the plurality of second electrodes may be spaced apart and insulated from the plurality of first electrodes.

The applying the negative voltage to the substrate may include applying a first negative voltage to the plurality of first electrodes and applying a second negative voltage to the plurality of second electrodes.

The first negative voltage and the second negative voltage may be direct current ("DC") voltages.

For the respective recesses, the applying the negative voltage to the substrate may attract the first contact pads of the separated LED chips to the plurality of first electrodes of the substrate, and may attract the second contact pads of the separated LED chips to the second electrodes of the substrate.

The method may further include encapsulating the plurality of LED chips mounted on the plurality of first electrodes, on the substrate, after the removing and drying the substrate.

Each of the plurality of LED chips may be individually encapsulated on the substrate.

The plurality of LED chips may be encapsulated on the substrate by a common encapsulation member.

According to one or more exemplary embodiments, a full-color display apparatus is manufactured by the above method.

Other features and merits of the invention in addition to the above description will be apparent from drawings, claims, and detailed description below.

BRIEF DESCRIPTION OF THE DRAWINGS

These and/or other features will become apparent and more readily appreciated from the following description of the exemplary embodiments, taken in conjunction with the accompanying drawings in which.

DETAILED DESCRIPTION

Figure 1:
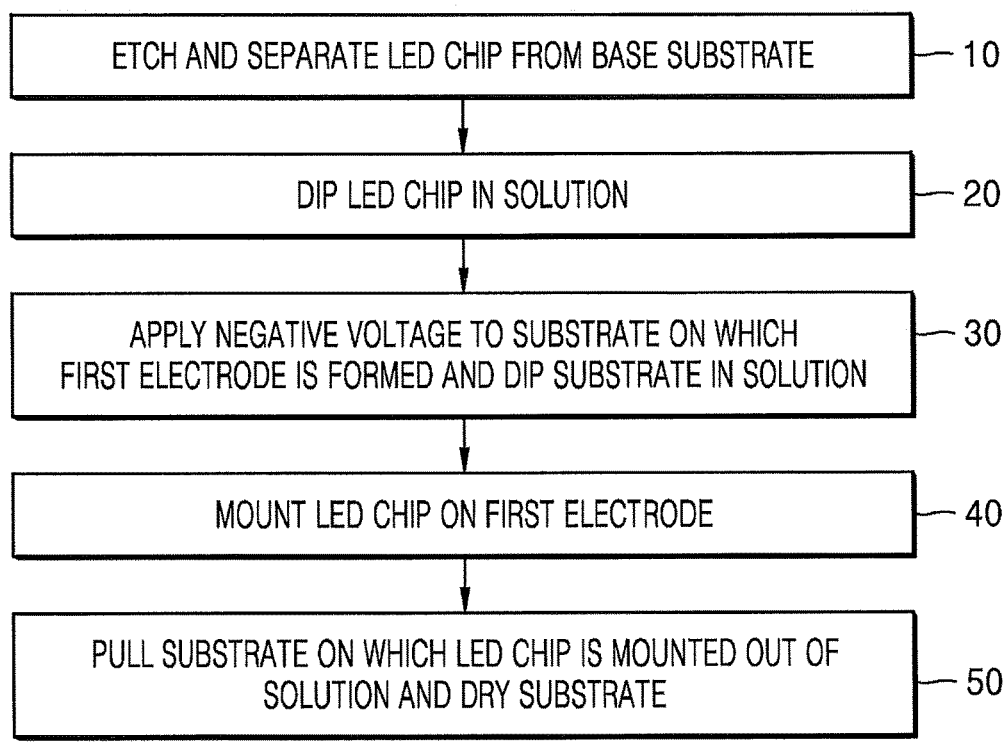
FIG. 1 is a flowchart illustrating an exemplary embodiment of a method of manufacturing a display apparatus, according to the invention.

Reference will now be made in detail to exemplary embodiments, examples of which are illustrated in the accompanying drawings, where like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain features of the present description.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a flowchart illustrating an exemplary embodiment of a method of manufacturing a display apparatus according to the invention.

Referring to FIG. 1, according to the exemplary embodiment of the method of manufacturing a display apparatus according to the invention, a light-emitting diode ("LED") chip is separated from a base substrate such as via an etching process (10), the LED chip is dipped in a solution (20), a negative voltage is applied to a substrate including a first electrode thereon and the substrate is dipped in the solution (30), the LED chip is mounted on the first electrode of the substrate (40), and the substrate with the LED chip mounted to the first electrode is pulled out of the solution and dried (50).

The exemplary embodiment of the method of manufacturing a display apparatus, according to the invention, will be described in more detail below with reference to FIGS. 2A to 5F.

Figure 2A:
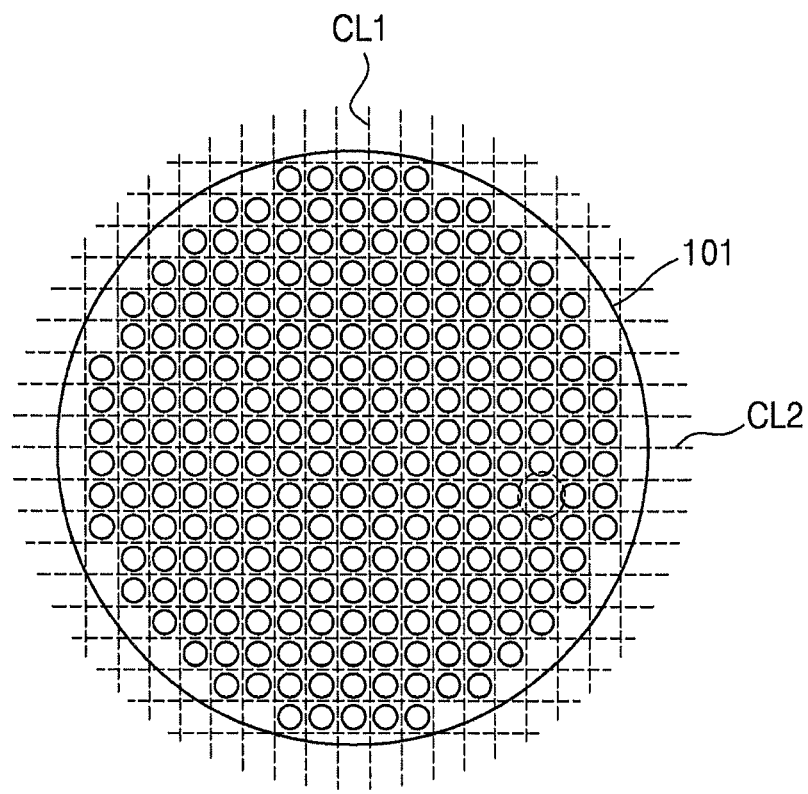
FIGS. 2A and 2B are a top plan view and a cross-sectional view of a plurality of light-emitting diode ("LED") chips on a base substrate, according to the invention.
Figure 2B:
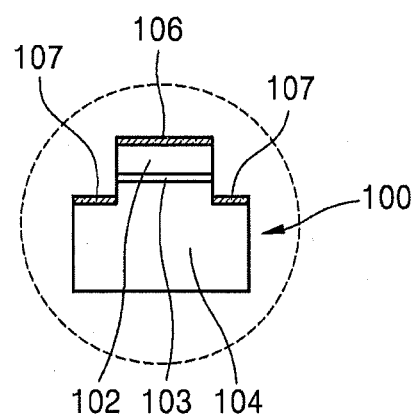

FIGS. 2A and 2B are a top plan view and a cross-sectional view of an LED chip 100 provided in plural on a base substrate 101. Each LED chip 100 generates and emits color light.

The base substrate 101 may be a conductive substrate or an insulating substrate. In an exemplary embodiment, for example, the base substrate 101 may include at least one of sapphire ($Al_2O_3$), SiC, Si, GaAs, GaN, ZnO, Si, GaP, InP, Ge, and $Ga_2O_3$.

The LED chip 100 may include a first semiconductor layer 102, a second semiconductor layer 104, an active layer 103 disposed between the first semiconductor layer 102 and the second semiconductor layer 104, a first electrode pad 106 at a distal end of the LED chip 100 and a second electrode pad 107.

In an exemplary embodiment of manufacturing the display apparatus, the first semiconductor layer 102, the active layer 103 and the second semiconductor layer 104 of the LED chip 100 may be formed by using a metal organic chemical vapor deposition ("MOCVD") method, a chemical vapor deposition ("CVD") method, a plasma-enhanced CVD ("PECVD") method, a molecular beam epitaxy ("MBE") method, and a hydride vapor phase epitaxy ("HVPE") method.

The first semiconductor layer 102 may include, for example, a p-type semiconductor layer. The p-type semiconductor layer may include a semiconductor material having a composition formula of $In_xAl_yGa_{1-x-y}N$ ($0 \leq x \leq 1$, $0 \leq y \leq 1$, and $0 \leq x+y \leq 1$), for example, GaN, AlN, AlGaN, InGaN, InN, InAlGaN, or AlInN, and may be doped with a p-type dopant such as Mg, Zn, Ca, Sr, and Ba.

The second semiconductor layer 104 may include, for example, an n-type semiconductor layer. The n-type semiconductor layer may include a semiconductor material having a composition formula of $In_xAl_yGa_{1-x-y}N$ ($0 \leq x \leq 1$, $0 \leq y \leq 1$, and $0 \leq x+y \leq 1$), for example, GaN, AlN, AlGaN, InGaN, InN, InAlGaN, or AlInN, and may be doped with an n-type dopant such as Si, Ge, and Sn.

However, one or more exemplary embodiments are not limited to the above examples, and the first semiconductor layer 102 may include an n-type semiconductor layer and the second semiconductor layer 104 may include a p-type semiconductor layer.

The active layer 103 is an area where electrons and holes recombine with each other, and transition to a lower energy level when the electrons and the holes recombine, and accordingly, light having a wavelength corresponding to the transitioned energy level is emitted. The active layer 103 may include a semiconductor material having a composition formula, for example, $In_xAl_yGa_{1-x-y}N$ ($0 \leq x \leq 1$, $0 \leq y \leq 1$, and $0 \leq x+y \leq 1$), and may have a single quantum well structure or a multiple quantum well ("MQW") structure. Also, the active layer 103 may have a quantum wire structure or a quantum dot structure.

The first electrode pad 106 is disposed or formed on the first semiconductor layer 102 at the distal end of the LED chip 100, and the second electrode pad 107 may be disposed or formed on the second semiconductor layer 104. The LED chip 100 according to the present exemplary embodiment is a parallel type or a flip type, in which the first electrode pad 106 and the second electrode pad 107 are arranged in the same direction as each other. The first electrode pad 106 and the second electrode pad 107 of the LED chip 100 are both disposed exposed or facing a same direction relative to the LED chip 100.

The plurality of LED chips 100 disposed or formed on the base substrate 101 are isolated from each other such as by cutting the base substrate 101 along cutting lines CL1 and CL2. The cutting may include using a laser beam. The plurality of LED chips 100 may be respectively disposed in a separable state relative to the base substrate 101 from the cutting of the base substrate 101. Subsequently, the separable state LED chips 100 may be separated from the base substrate 101 such as through a laser lift-off process.

Figure 3:
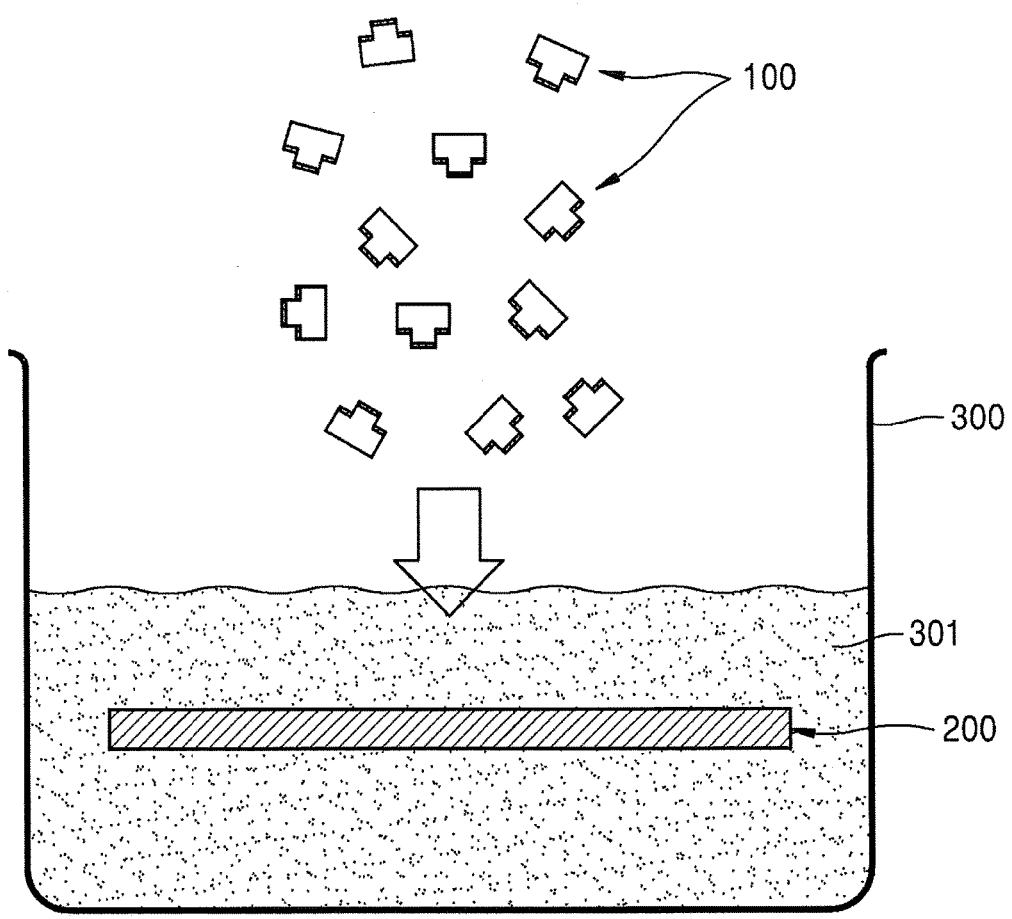
FIG. 3 is a cross-sectional view showing an exemplary embodiment of process in which an array substrate is disposed in a solution and a plurality of LED chips are dropped onto the array substrate, according to the invention.
Figure 4:
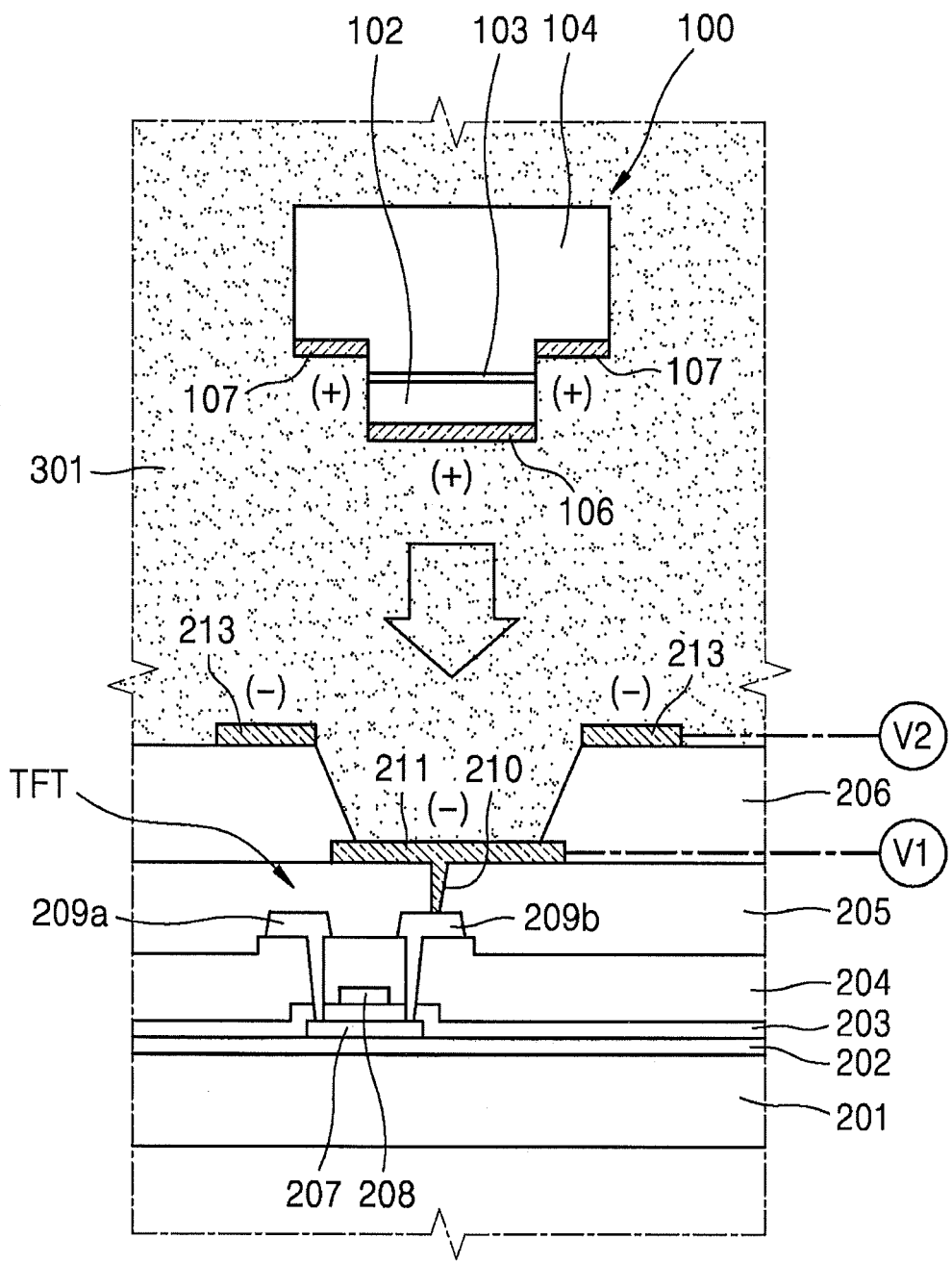
FIG. 4 is an enlarged cross-sectional view of a portion of the array substrate relative to the LED chip of FIG. 3.

FIG. 3 is a cross-sectional view showing an exemplary embodiment of a process in which an array substrate 200 is disposed in a container 300 in which a solution 301 is contained, and the plurality of LED chips 100 are dropped (indicated by the downward arrow) onto the array substrate 200, and FIG. 4 is an enlarged cross-sectional view of the array substrate 200 relative to the LED chip 100 on the array substrate 200 of FIG. 3.

Referring to FIGS. 3 and 4, the array substrate 200 includes at least one thin film transistor TFT on a substrate 201. A planarization layer 205 may be disposed on the thin film transistor TFT, and a first electrode 211 that is connected to the thin film transistor TFT via a via hole 210 may be disposed or formed on the planarization layer 205. In addition, the array substrate 200 may include a bank layer 206 disposed to partially cover the first electrode 211.

The substrate 201 may include various materials, for example, a glass material or a plastic material. The substrate 201 may be flexible such that the array substrate 200 may be flexible.

A buffer layer 202 may be disposed or formed on the substrate 201. The buffer layer 202 provides a flat surface on the substrate 201, and reduces or effectively prevents infiltration of impurities or humidity into the substrate 201.

The thin film transistor TFT may include an active layer 207, a gate electrode 208, a source electrode 209a and a drain electrode 209b. Hereinafter, the thin film transistor TFT of a top gate type, in which the active layer 207, the gate electrode 208, the source electrode 209a and the drain electrode 209b are sequentially stacked, will be described. However, one or more exemplary embodiments are not limited thereto, and a thin film transistor TFT of various types, for example, a bottom gate type, may be also applied to one or more exemplary embodiments.

The active layer 207 may include a semiconductor material, for example, amorphous silicon or polycrystalline silicon. The active layer 207 may include an organic semiconductor material, an oxide semiconductor material, etc.

A gate insulating layer 203 is disposed or formed on the active layer 207. The gate electrode 208 is disposed or formed on the gate insulating layer 203. The gate electrode 208 may be connected to a gate line (not shown) which applies turning on/turning off signals to the thin film transistor TFT.

An inter-insulating layer 204 is disposed or formed on the gate electrode 208, and the source electrode 209a and the drain electrode 209b are disposed or formed on the inter-insulating layer 204.

The first electrode 211 connected to the thin film transistor TFT is formed on the planarization layer 205, and a second electrode 213 may be disposed or formed on the bank layer 206. The first electrode 211 and the second electrode 213 are spaced apart from each other and may be disconnected from each other within the array substrate 200 excluding the LED chip 100. For purpose of this description, positions of the first electrode 211 and the second electrode 213 may be referred to as defining a shape of the first and second electrodes 211 and 213.

In a state where the array substrate 200 is disposed in the solution 301, a first voltage V1 is applied to the first electrode 211 and a second voltage V2 is applied to the second electrode 213. The first and second voltages V1 and V2 are respectively negative direct current ("DC") voltages.

Since negative DC voltages are applied to the first electrode 211 and the second electrode 213, free electrons of the LED chip 100 that is dropped into the solution 301 move away from the first electrode 211 and the second electrode 213. In addition, due to an electrostatic induction effect, a positive potential is induced to a portion of the LED chip 100, which is close to the first and second electrodes 211 and 213 to which the negative voltages are applied. That is, the positive potential is induced to the first and second electrode pads 106 and 107 of the LED chip 100.

An attraction caused by an electrostatic force may be applied between the first electrode 211 and the second electrode 213 in the array substrate 200 and the first electrode pad 106 and the second electrode pad 107 of the LED chip 100, and the LED chip 100 may move toward the array substrate 200 by the electrostatic force.

Here, since the first electrode pad 106 and the second electrode pad 107 of the LED chip 100 and the first electrode 211 and the second electrode 213 of the array substrate 200 have matching or complementing shapes, the first electrode pad 106 of the LED chip 100 is arranged to be adjacent and connected to the first electrode 211 of the array substrate 200 and the second electrode pad 107 of the LED chip 100 is arranged to be adjacent and connected to the second electrode 213 of the array substrate 200.

FIGS. 5A to 5F are schematic cross-sectional views illustrating an exemplary embodiment of processes of manufacturing a full-color LED display apparatus. FIGS. 5A to 5F illustrate processes of repeatedly performing the processes illustrated with reference to FIGS. 3 and 4 a plurality of times.

Figure 5A:
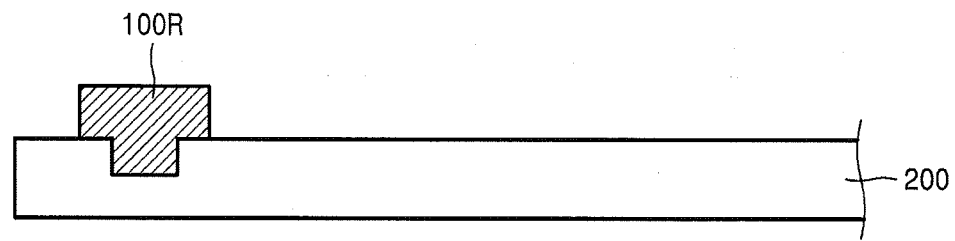
FIGS. 5A to 5F are schematic cross-sectional views illustrating an exemplary embodiment of processes of manufacturing a full-color LED display apparatus, according to the invention.

Referring to FIG. 5A, a red LED chip 100R is aligned on the array substrate 200 at a recess defined therein. In an exemplary embodiment, the red LED chip 100R is aligned on the array substrate 200 by the processes illustrated in FIGS. 3 and 4. The red LED chip 100R generates and emits a color light such as a red color.

Although not shown in FIG. 5A in detail, with reference to FIG. 4, a first electrode (not shown) connected to a thin film transistor of the array substrate 200 and a second electrode (not shown) spaced apart from the first electrode of the array substrate 200 are disposed or formed at the recess to define a shape complementing the shape of the red LED chip 100R. An overall shape of the red LED chip 100R may correspond to the overall shape of the recess at which the first and second electrodes are disposed.

Figure 5B:
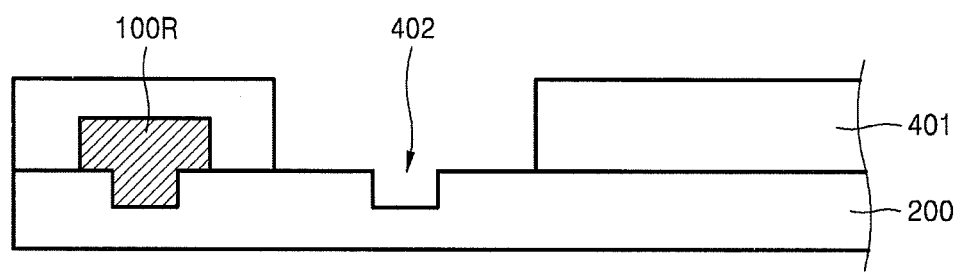

Referring to FIG. 5B, a passivation layer 401 is disposed to cover the red LED chip 100R, and a recess 402 is formed in a region at which a green LED chip 100G (see FIG. 5C) is to be disposed or formed.

Although not shown in FIG. 5B in detail, with reference to FIG. 4, a first electrode (not shown) connected to a thin film transistor of the array substrate 200 and a second electrode (not shown) spaced apart from the first electrode of the array substrate 200 are disposed or formed at the recess 402 to define a shape complementing the shape of the green LED chip 100G. The passivation layer 401 exposes the above-described structure of the array substrate 200 at the recess 402. An overall shape of the green LED chip 100G may correspond to the overall shape of the recess 402 at which the first and second electrodes are disposed.

Negative voltages are respectively applied to the first electrode (not shown) and the second electrode (not shown), and the green LED chip 100G separated from the base substrate 101 is dropped into a container, in which the solution is contained, in the same manner as illustrated in FIG. 3.

Figure 5C:
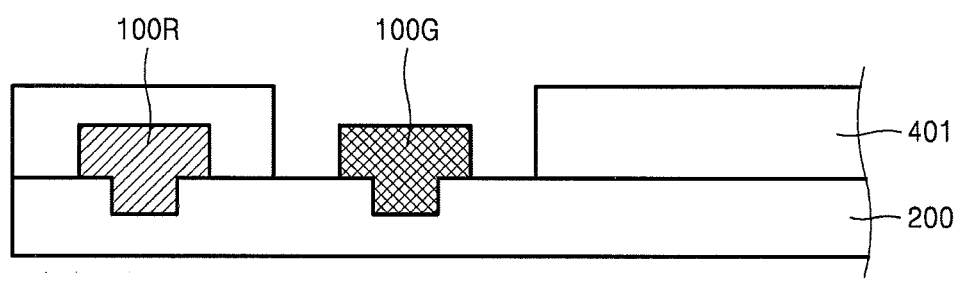

Referring to FIG. 5C, the green LED chip 100G is moved into the recess 402 to be aligned on the array substrate 200. The green LED chip 100G generates and emits a color light different from that of the red LED chip 100R, such as generating and emitting a green color.

Figure 5D:
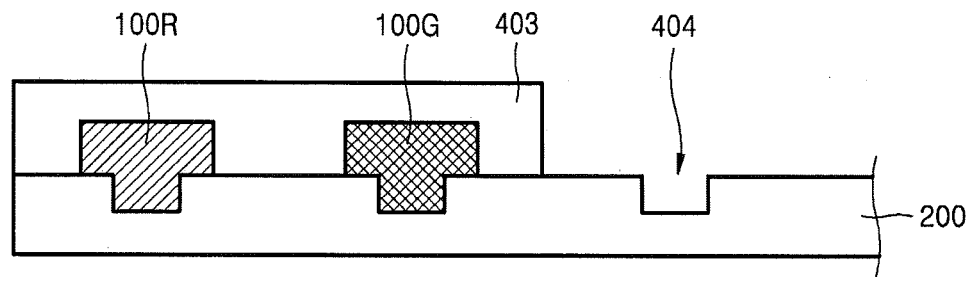

Referring to FIG. 5D, a passivation layer 403 is disposed to cover the red LED chip 100R and the green LED chip 100G, and a recess 404 is formed in a region at which a blue LED chip 100B (see FIG. 5E) is to be disposed or formed.

Although not shown in FIG. 5D in detail, with reference again to FIG. 4, a first electrode (not shown) connected to a thin film transistor of the array substrate 200 and a second electrode (not shown) spaced apart from the first electrode of the array substrate 200 are disposed or formed at the recess 404 to define a shape complementing the shape of the blue LED chip 100B. The passivation layer 403 exposes the above-described structure of the array substrate 200 at the recess 404. An overall shape of the blue LED chip 100B may correspond to the overall shape of the recess 404 at which the first and second electrodes are disposed.

Negative voltages are applied respectively to the first electrode (not shown) and the second electrode (not shown), and the blue LED chip 100B is dropped into a container, in which the solution is contained, in the same manner as illustrated in FIG. 3.

Figure 5E:
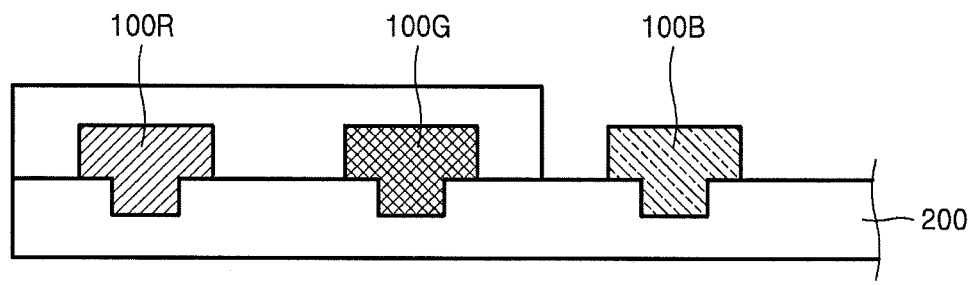

Referring to FIG. 5E, the blue LED chip 100B is moved into the recess 404 to be aligned on the array substrate 200. The blue LED chip 100B generates and emits a color light different from that of the red and green LED chips 100R and 100G, such as generating and emitting a blue color.

Figure 5F:
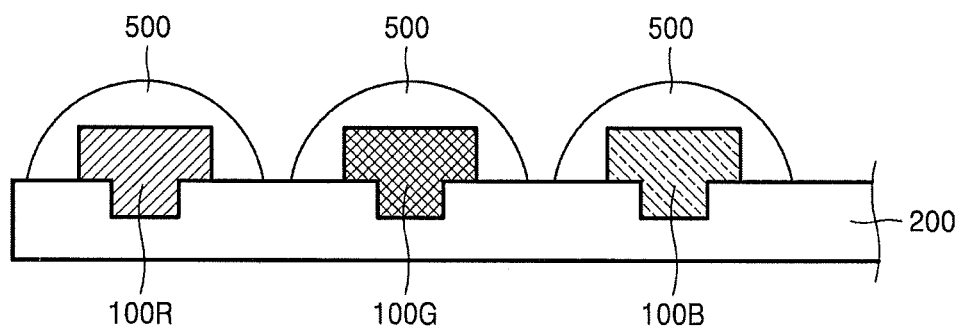

Referring to FIG. 5F, after aligning the LED chips 100R, 100G and 100B on the array substrate 200, an encapsulation process in which an encapsulation member 500 is provided in plural respectively on each of the LED chips, namely, the red, green and blue chips 100R, 100G, and 100B, is performed.

FIG. 5F illustrates that each of the LED chips 100R, 100G and 100B is individually encapsulated, but all the LED chips 100R, 100G and 100B may be commonly encapsulated in an alternative exemplary embodiment.

Thus, the full-color display apparatus including LEDs may be manufactured to include the LED chips 100R, 100G and 100B encapsulated on the array substrate 200.

Figure 6:
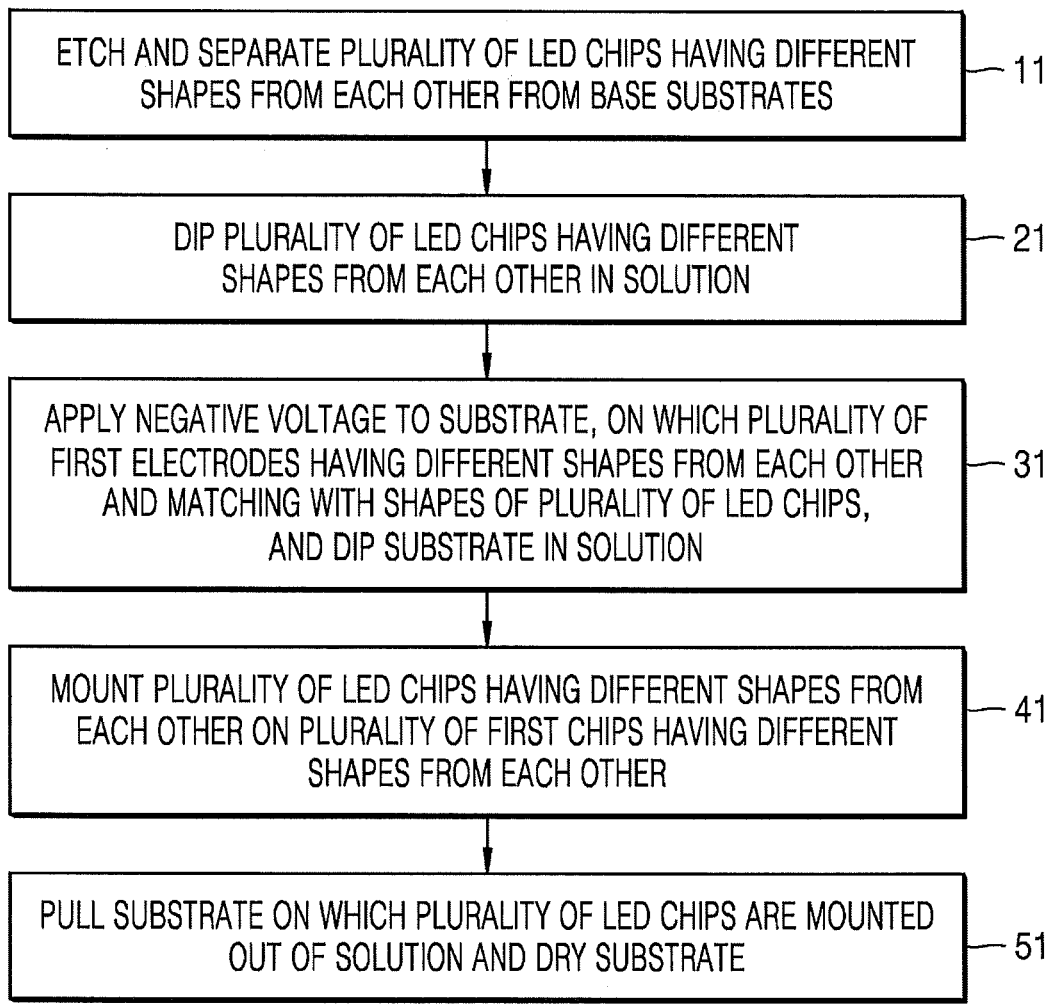
FIG. 6 is a flowchart illustrating another exemplary embodiment of a method of manufacturing a display apparatus, according to the invention.

FIG. 6 is a flowchart illustrating another exemplary embodiment of a method of manufacturing a display apparatus, according to the invention.

Referring to FIG. 6, another exemplary embodiment of a method of manufacturing a display apparatus, according to the invention includes etching and separating a plurality of LED chips having different shapes from each other from respective base substrates (11), dipping the plurality of LED chips having different shapes from each other in a solution (21), applying a negative voltage to a substrate including thereon a plurality of first electrodes having different shapes from each other corresponding to the shapes of the plurality of LED chips, and disposing the substrate into the solution (31), mounting the plurality of LED chips having different shapes from each other onto the plurality of first electrodes having different shapes from each other (41), and pulling out the substrate with the plurality of LED chips having different shapes from each other mounted to the plurality of first electrodes having different shapes from each other from the solution and drying the substrate (51).

Different from the previous exemplary embodiment, one etching/transferring/bonding process may be performed to realize full-color for a display apparatus without performing the etching/transferring/bonding processes a plurality of times.

Referring to FIGS. 7A to 7D are schematic cross-sectional views illustrating another exemplary embodiment of processes of manufacturing a full-color LED display apparatus.

Figure 7A:
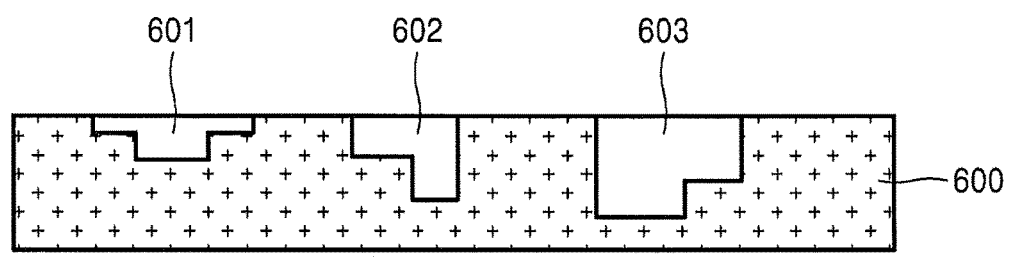
FIGS. 7A to 7D are schematic cross-sectional views illustrating another exemplary embodiment of processes of manufacturing a full-color LED display apparatus, according to the invention.

Referring to FIG. 7A, an array substrate 600 in which a plurality of recesses 601, 602 and 603 having different shapes from each other are formed, is provided.

Figure 7B:
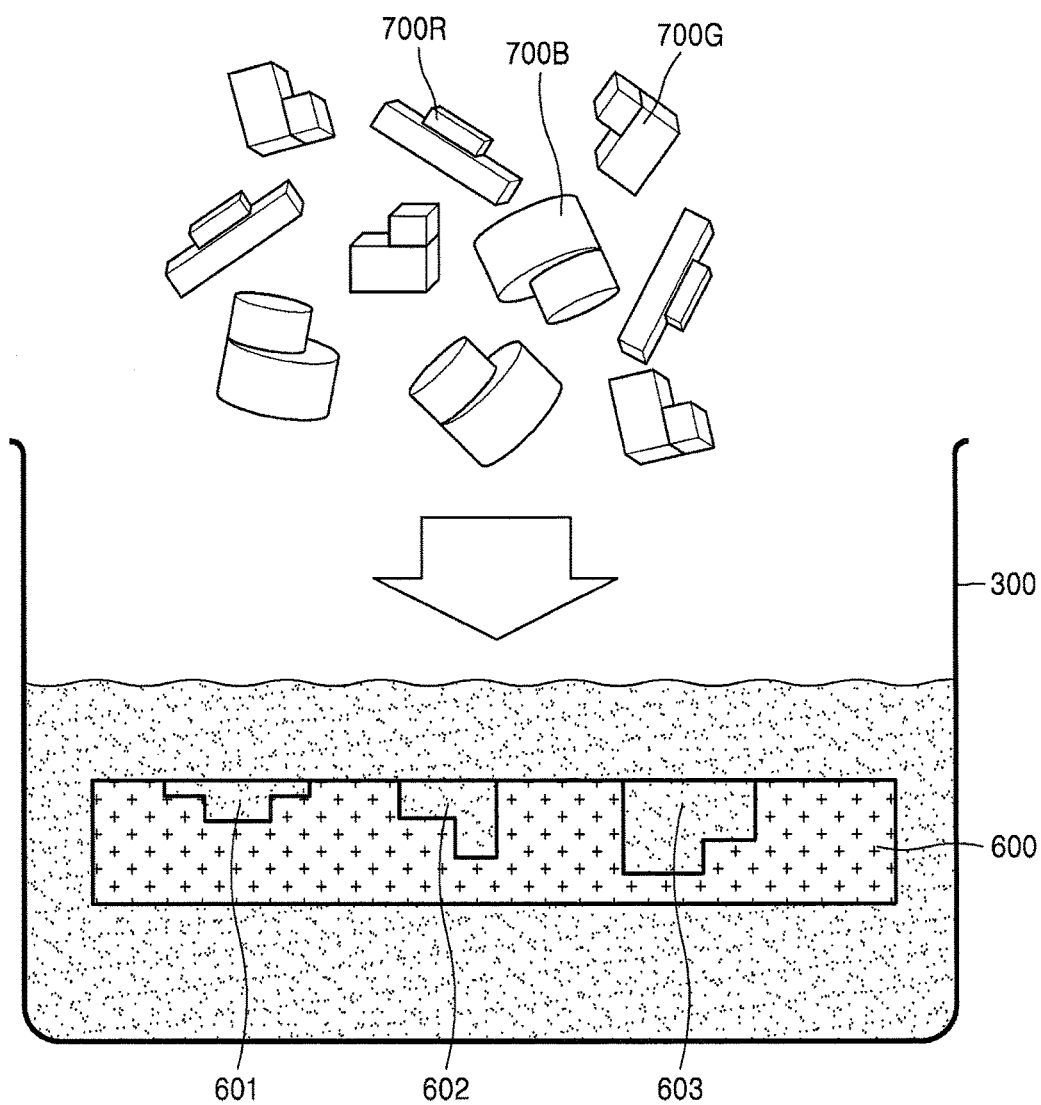

Referring to FIG. 7B, the array substrate 600 of FIG. 7A is disposed into a container 300 in which a solution 301 is contained. A plurality of red LED chips 700R, a plurality of green LED chips 700G and a plurality of blue LED chips 700B are put into the container 300 in which the solution 301 and the array substrate 600 are contained. Instead of same shape LED chips 100 disposed into the container 300 at one time, FIG. 7B illustrates red, green and blue LED chips 700R, 700G and 700B of different shapes are all put into the container 300 at a same time. The red, green and blue LED chips 700R, 700G and 700B generate and emit a color light different from each other, such as generating and emitting a red, green and blue color.

Although not shown in detail in the drawings, with reference again to FIG. 4, a first electrode (not shown) connected to a thin film transistor of the array substrate 600 and a second electrode (not shown) spaced apart from the first electrode of the array substrate 600 are disposed or formed at each of the recesses 601, 602 and 603. Negative DC voltages are respectively applied to the first electrode (not shown) and the second electrode (not shown) disposed or formed at each of the recesses 601, 602 and 603.

Figure 8:
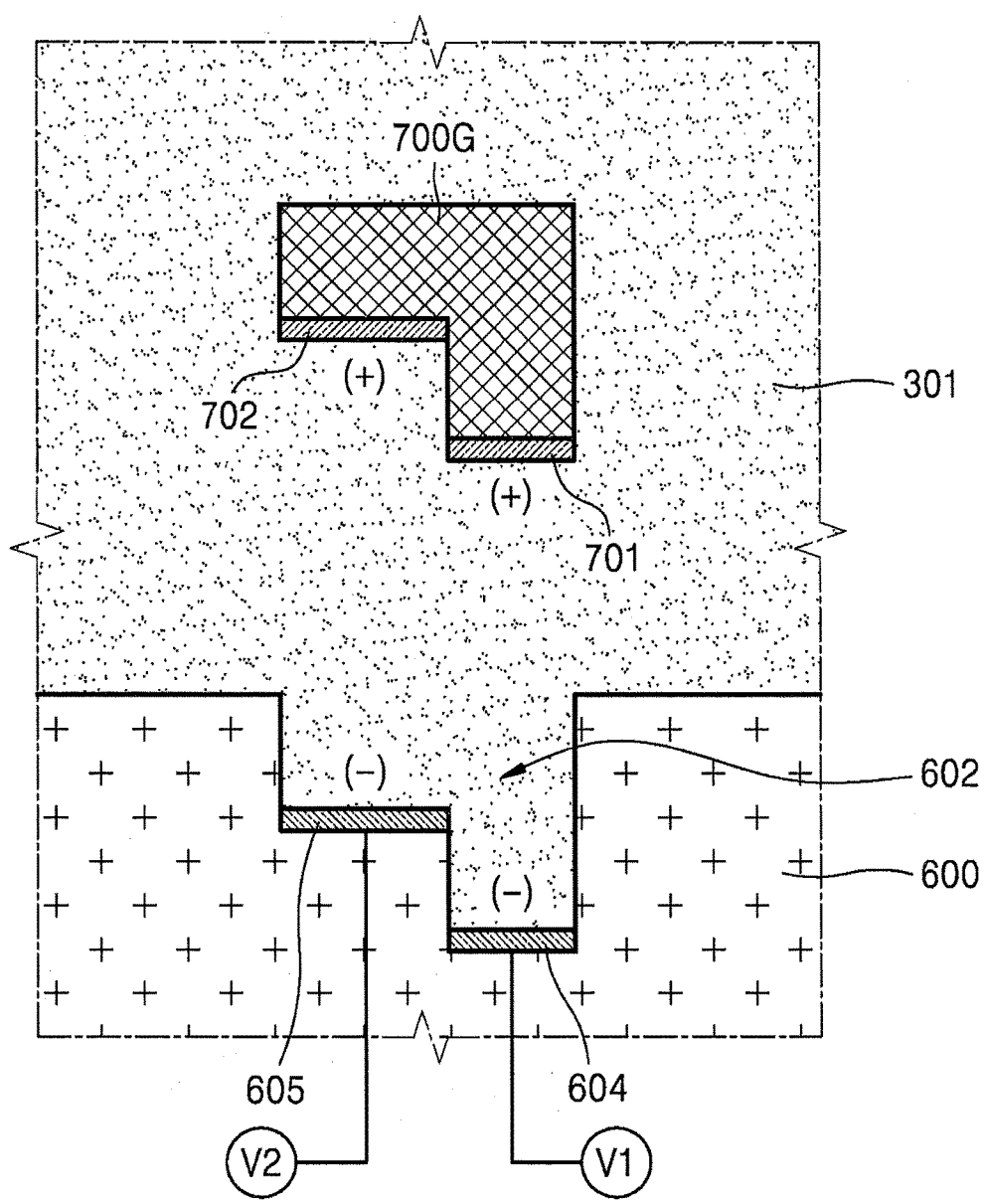
FIG. 8 is an enlarged cross-sectional view of an exemplary embodiment of a portion of an array substrate relative to a green LED chip, according to the invention.

FIG. 8 is a diagram showing an exemplary embodiment of the green LED chip 700G relative to first and second electrodes of the array substrate 600, while each is disposed within the solution 301. Referring to FIG. 8, in a thickness direction of the green LED chip 700G (e.g., vertical direction in FIG. 8), a first electrode pad 701 of the green LED chip 700G protrudes further than a second electrode pad 702 thereof, and the second electrode pad 702 is spaced horizontally and vertically apart from the first electrode pad 701.

In the array substrate 600 recess 602 corresponding to the green LED chip 700G, a first electrode 604 and a second electrode 605 are disposed or formed to have shapes or positions complementing the shape of the first and second electrode pads 701 and 702 of the green LED chip 700G. An overall shape of the green LED chip 700G may correspond to the overall shape of the recess 602 at which the first and second electrodes 604 and 605 are disposed. For purpose of this description, positions of the first electrode 604 and the second electrode 605 within the array substrate 600 may be referred to as defining a shape of the first and second electrodes 604 and 605.

Negative DC voltages are applied to the first and second electrodes 604 and 605 and positive potentials are induced to the first and second electrode pads 604 and 605 of the green LED chip 700G. An attraction caused by the electrostatic force is applied between the first and second electrodes 604 and 605 of the array substrate 600 and the first and second electrode pads 701 and 702 of the green LED chip 700G. Accordingly, the green LED chip 700G may be moved toward the array substrate 600.

Figure 7C:
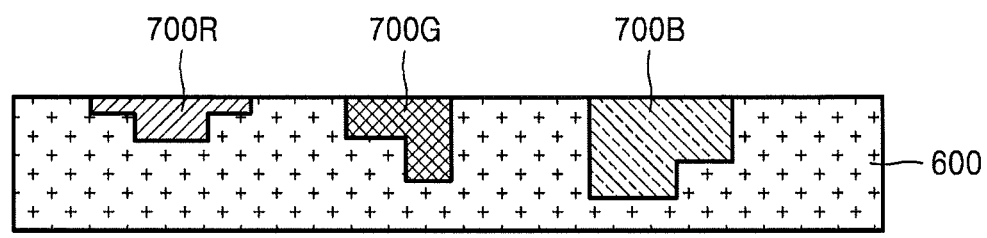

Referring to FIG. 7C, a plurality of red LED chips 700R, a plurality of green LED chips 700G and a plurality of blue LED chips 700B may be respectively aligned with the array substrate 600 at recesses 601, 602 and 603 through one electrostatic induction process performed at a same time.

Figure 7D:
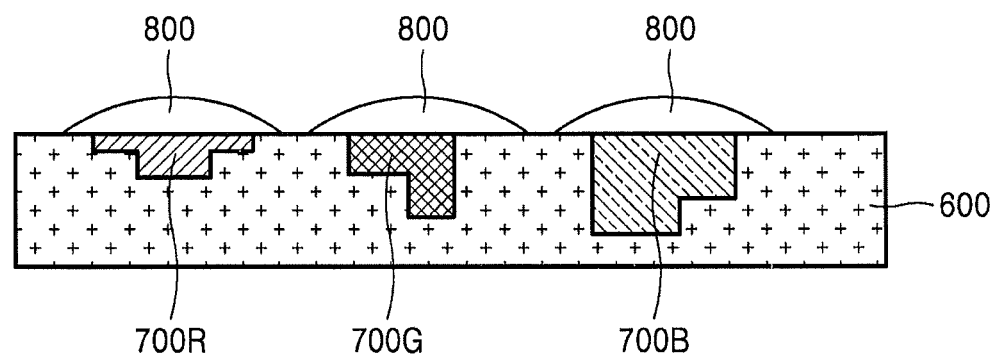

Referring to FIG. 7D, after finishing arrangements of the plurality of LED chips 700R, 700G, and 700B on the array substrate 600, an encapsulation process for forming an encapsulation member 800 on each of the LED chips, namely, the green, blue, and blue LED chips 700R, 700G, and 700B, is performed.

In FIG. 7D illustrates that each of the LED chips 700R, 700G, and 700B is individually encapsulated, but all the LED chips 700R, 700G and 700B may be commonly encapsulated at the same time in an alternative exemplary embodiment.

Thus, the full-color display apparatus including the LEDs may be manufactured by performing the electrostatic induction process once, to include the LED chips 100R, 100G and 100B encapsulated on the array substrate 600.

According to the one or more exemplary embodiments, the LEDs may be transferred to and aligned with positions of an array substrate in a simple manner by using electrostatic force.

In addition, a shape of the LED chip varies depending on a color of light emitted therefrom. The substrate includes regions at which the LED chips of different shapes are to be mounted, to have shapes matching with those of the LED chips. Accordingly, the different-shaped LED chips emitting different color light may be mounted on the substrate by performing an alignment process once.

It should be understood that exemplary embodiments described herein should be considered in a descriptive sense only and not for purposes of limitation. Descriptions of features within each exemplary embodiment should typically be considered as available for other similar features in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    separating a light-emitting diode chip from a base substrate;
    disposing the separated light-emitting diode chip in a solution;
    disposing a substrate including a first electrode and a second electrode which is spaced apart from the first electrode to be insulated from the first electrode thereon, in the solution;
    with the separated light-emitting diode chip and the substrate including the first and second electrode thereon in the solution, applying a negative voltage to the substrate to attract the separated light-emitting diode chip to the first and second electrodes on the substrate,
    wherein the applying the negative voltage to the substrate comprises applying a first negative voltage to the first electrode and applying a second negative voltage to the second electrode;
    mounting the light-emitting diode chip attracted to the first and second electrode, on the first and second electrodes; and
    removing the substrate with the light-emitting diode chip mounted on the first and second electrodes from the solution and drying the removed substrate, to form the display apparatus.

2. The method of claim 1, wherein the separated light-emitting diode chip is a flip chip comprising a first contact pad and a second contact pad exposed facing a same direction.

3. The method of claim 2, wherein the applying the negative voltage to the substrate attracts the first contact pad of the separated light-emitting diode chip to the first electrode of the substrate, and attracts the second contact pad of the separated light-emitting diode chip to the second electrode of the substrate.

4. The method of claim 1, wherein the first and second negative voltages are direct current voltages.

5. The method of claim 1, further comprising encapsulating the light-emitting diode chip mounted on the first and second electrodes, on the substrate, after the removing and drying the substrate.

6. The method of claim 5, wherein the light-emitting diode chip is individually encapsulated on the substrate.

7. The method of claim 5, wherein
    the separating the light-emitting diode chip from the base substrate comprises separating plural light-emitting diode chips which respectively emit different color lights from each other, from the base substrate, and
    a plurality of the light-emitting diode chips is encapsulated on the substrate by a common encapsulation member.

8. The method of claim 1, wherein
    the separating the light-emitting diode chip from the base substrate comprises separating plural light-emitting diode chips which respectively emit different color lights from each other, from the base substrate, and
    the mounting the light-emitting diode chip comprises mounting a first color light-emitting diode chip on the first and second electrodes,
    the method further comprising after the removing and drying the substrate with the first color light-emitting diode chip mounted on the first and second electrodes, covering the first color light-emitting diode chip mounted on the first and second electrodes by a passivation layer, and
    for all other color light-emitting diode chips among the plural light-emitting diode chips, repeatedly performing the disposing the separated light-emitting diode chip in the solution, the applying the negative voltage to the substrate, the mounting the light-emitting diode chip and the removing and drying the substrate.

9. A method of manufacturing a display apparatus, the method comprising:
    separating a plurality of light-emitting diode chips having different shapes from each other, respectively from base substrates;
    disposing all of the separated plurality of light-emitting diode chips having the different shapes in a solution;
    preparing a substrate including a plurality of recesses each of which includes disposed therein a first electrode and a second electrode which is spaced apart from the first electrode to be insulated from the first electrode;
    disposing the substrate including the plurality of recesses in which the first and second electrodes are respectively disposed, in the solution, the recesses having different shapes respectively corresponding to the different shapes of the plurality of light-emitting diode chips;
    with the separated light-emitting diode chips and the substrate including the plurality of first and second electrodes in the recesses thereof in the solution, applying a negative voltage to the substrate to respectively attract the separated light-emitting diode chips to the plurality of first and second electrodes of the correspondingly shaped recesses of the substrate,
    wherein the applying the negative voltage to the substrate comprises applying a first negative voltage to the plurality of first electrodes and applying a second negative voltage to the plurality of second electrodes;
    respectively mounting the plurality of light-emitting diode chips attracted to the plurality of first and second electrodes in the recesses having the different shapes, on the plurality of first and second electrodes; and
    removing the substrate with the plurality of light-emitting diode chips mounted on the plurality of first and second electrodes from the solution and drying the removed substrate to form the display apparatus.

10. The method of claim 9, wherein from among the separated light-emitting diode chips having different shapes from each other, each light-emitting diode chip is a flip chip comprising a first contact pad and a second contact pad exposed facing a same direction.

11. The method of claim 10, wherein for the respective recesses, the applying the negative voltage to the substrate attracts the first contact pads of the separated light-emitting diode chips to the plurality of first electrodes of the substrate, and attracts the second contact pads of the separated light-emitting diode chips to the second electrodes of the substrate.

12. The method of claim 9, wherein the first negative voltage and the second negative voltage are direct current voltages.

13. The method of claim 9, further comprising encapsulating the plurality of light-emitting diode chips mounted on the plurality of first and second electrodes, on the substrate, after the removing and drying the substrate.

14. The method of claim 13, wherein the plurality of light-emitting diode chips is individually encapsulated on the substrate.

15. The method of claim 13, wherein the plurality of light-emitting diode chips is encapsulated on the substrate by a common encapsulation member.

16. A display apparatus manufactured by the method of claim 9.

* * * * *